(12) United States Patent
Newton et al.

(10) Patent No.: US 7,494,560 B2
(45) Date of Patent: Feb. 24, 2009

(54) NON-PLASMA REACTION APPARATUS AND METHOD

(75) Inventors: Christopher A. Newton, Jericho, VT (US); Robert D. Ostromecki, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 666 days.

(21) Appl. No.: 10/065,879

(22) Filed: Nov. 27, 2002

(65) Prior Publication Data

US 2004/0099377 A1    May 27, 2004

(51) Int. Cl.
*H01L 21/306* (2006.01)
*C23C 16/00* (2006.01)
*C23C 16/455* (2006.01)

(52) U.S. Cl. .......................... 156/345.34; 156/345.33; 156/345.29; 118/715

(58) Field of Classification Search ............ 156/345.34, 156/345.33, 345.29; 118/715
See application file for complete search history.

(56) References Cited

U.S. PATENT DOCUMENTS

| | | | | |
|---|---|---|---|---|
| 4,949,671 A | * | 8/1990 | Davis et al. ................. | 118/725 |
| 5,200,016 A | * | 4/1993 | Namose ................. | 156/345.25 |
| 5,282,925 A | | 2/1994 | Jeng et al. ................... | 156/646 |
| 5,624,498 A | * | 4/1997 | Lee et al. ..................... | 118/715 |
| 5,718,795 A | * | 2/1998 | Plavidal et al. ......... | 156/345.46 |
| 5,792,269 A | * | 8/1998 | Deacon et al. .............. | 118/715 |
| 5,837,093 A | * | 11/1998 | Hasegawa et al. ...... | 156/345.33 |
| 5,838,055 A | * | 11/1998 | Kleinhenz et al. ........... | 257/510 |
| 5,997,950 A | | 12/1999 | Telford et al. .......... | 427/255.392 |
| 6,059,885 A | | 5/2000 | Ohashi et al. ............... | 118/730 |
| 6,068,703 A | | 5/2000 | Chen et al. .................. | 118/715 |
| 6,086,677 A | * | 7/2000 | Umotoy et al. .............. | 118/715 |
| 6,126,753 A | | 10/2000 | Shinriki et al. .............. | 118/715 |
| 6,132,512 A | | 10/2000 | Horie et al. ................. | 118/715 |
| 6,178,919 B1 | * | 1/2001 | Li et al. .................... | 118/723 E |
| 6,206,972 B1 | | 3/2001 | Dunham ..................... | 118/715 |
| 6,251,188 B1 | * | 6/2001 | Hashimoto et al. .......... | 118/715 |
| 6,274,495 B1 | | 8/2001 | Omstead et al. ............. | 438/680 |
| 6,676,760 B2 | * | 1/2004 | Kholodenko et al. ........ | 118/728 |

(Continued)

FOREIGN PATENT DOCUMENTS

JP          03-281780     * 12/1991

(Continued)

*Primary Examiner*—Jeffrie R Lund
(74) *Attorney, Agent, or Firm*—Schmeiser, Olsen & Watts; Anthony J. Canale

(57) ABSTRACT

An apparatus and method for forming a self-limiting etchable layer on a workpiece. The apparatus comprises: a chamber adapted for holding a workpiece; a distribution plate within the chamber, wherein the distribution plate includes channels for introducing a first fluid (e.g., ammonia) and a second fluid (e.g., hydrogen fluoride) into the apparatus, such that the first and second fluids may be directed into the apparatus at the angles $\theta_1$ and $\theta_2$ with respect to an exposed surface of the distribution plate, wherein the channels for each type of fluid may be arranged respectively in alternating rings, and wherein each angle $\theta_1$ and $\theta_2$ are at least 45 degrees and less than 90 degrees, offset by $\alpha_2$ and $\beta_2$ and $\alpha_1$ and $\beta_1$ by analogy. The method for forming the etchable layer on the workpiece comprises introducing a first fluid and a second fluid into the chamber through the channels.

14 Claims, 9 Drawing Sheets

U.S. PATENT DOCUMENTS

| | | | |
|---|---|---|---|
| 6,685,848 B1 * | 2/2004 | Sasaki et al. | 216/75 |
| 6,726,801 B2 * | 4/2004 | Ahn | 156/345.29 |
| 6,733,620 B1 * | 5/2004 | Sugiyama et al. | 156/345.29 |
| 6,797,639 B2 * | 9/2004 | Carducci et al. | 438/710 |
| 6,821,347 B2 * | 11/2004 | Carpenter et al. | 118/696 |
| 6,884,296 B2 * | 4/2005 | Basceri et al. | 118/715 |
| 2001/0032591 A1 * | 10/2001 | Carducci et al. | 118/723 E |
| 2003/0019579 A1 * | 1/2003 | Ahn | 156/345.29 |
| 2003/0047281 A1 * | 3/2003 | Hirose et al. | 156/345.33 |
| 2004/0003777 A1 * | 1/2004 | Carpenter et al. | 118/715 |
| 2004/0065344 A1 * | 4/2004 | Oka et al. | 134/1.1 |
| 2004/0099377 A1 * | 5/2004 | Newton et al. | 156/345.33 |
| 2005/0022739 A1 * | 2/2005 | Carpenter et al. | 118/715 |

FOREIGN PATENT DOCUMENTS

| | | | |
|---|---|---|---|
| SU | 598630 | * | 2/1978 |

* cited by examiner

NON-PLASMA REACTION APPARATUS AND METHOD

BACKGROUND OF THE INVENTION

1. Technical Field

The present invention generally relates to an apparatus and method for forming a surface film, and more particularly, to an apparatus and method for performing a non-plasma chemical reaction to form the surface film.

2. Background Art

The ability to control etching by hydrogen fluoride (HF) to a given thickness of a surface layer of a workpiece that has been adapted for etching is an important prerequisite for accurate etching in the manufacture of an integrated circuit (IC). The surface layer of the workpiece may be adapted for etching by forming a surface layer that is an oxide of the material of the workpiece. If the workpiece comprises silicon or germanium, the surface layer of the workpiece may be adapted for etching by forming the surface layer of silicon dioxide ($SiO_2$) or germanium dioxide ($GeO_2$). Pure hydrogen fluoride (HF) may etch the adapted surface layer by forming gaseous silicon tetrafluoride ($SiF_4$). The gaseous $SiF_4$ is very volatile such that exposing the surface layer to HF readily etches the surface layer, thereby exposing a remaining layer of oxide to etching by the HF. Etching to the given thickness is difficult to control because the formation of $SiF_4$ continues until the surface layer, i.e., the oxide layer, has been completely etched due to formation and evaporation of $SiF_4$.

In view of the need to control the etching thickness when the adapted surface layer of a workpiece is exposed to HF, there is a need for an apparatus and method that provides controlled etching of the adapted surface layer with HF.

BRIEF SUMMARY OF THE INVENTION

The present invention provides an apparatus for forming a self-limiting etchable layer on a workpiece, comprising:
a chamber adapted for holding a workpiece, wherein a surface layer of the workpiece has been adapted for being etched; and
a distribution plate within the chamber, wherein the distribution plate comprises a first plurality of channels for providing a first fluid to flow into the chamber at an angle $\theta_1$ with respect to an exposed surface of the distribution plate and a second plurality of channels for providing a second fluid to flow into the chamber at an angle $\theta_2$ with respect to the exposed surface of the distribution plate, and wherein the first plurality of channels and the second plurality of channels are arranged in rings around a common point of the distribution plate;
wherein the first fluid and the second fluid are adapted to react inside the chamber to form a self-limiting etchable layer on a portion of the adapted surface layer of the workpiece.

A second embodiment of the present invention provides a method comprising:
providing a workpiece within a chamber, wherein a surface layer of the workpiece has been adapted for being etched;
providing a distribution plate over the workpiece, wherein the distribution plate includes a first plurality of channels for providing a first fluid to flow into the chamber at an angle $\theta_1$ with respect to an exposed surface of the distribution plate and a second plurality of channels for providing a second fluid to flow into the chamber at an angle $\theta_2$ with respect to the exposed surface of the distribution plate, and wherein the first plurality of channels and the second plurality of channels are arranged in rings around a common point of the distribution plate; and
forming a self-limiting etchable layer by providing the first and second fluids over the adapted surface layer of the workpiece.

A third embodiment of the present invention provides a distribution plate comprising:
a first plurality of channels for providing a first fluid to flow into a chamber at an angle $\theta_1$ with respect to an exposed surface of the distribution plate; and
a second plurality of channels for providing a second fluid to flow into the chamber at an angle $\theta_2$ with respect to the exposed surface of the distribution plate;
wherein the first plurality of channels and the second plurality of channels are arranged in rings around a common point of the distribution plate.

DETAILED DESCRIPTION OF THE INVENTION

Figure 1:
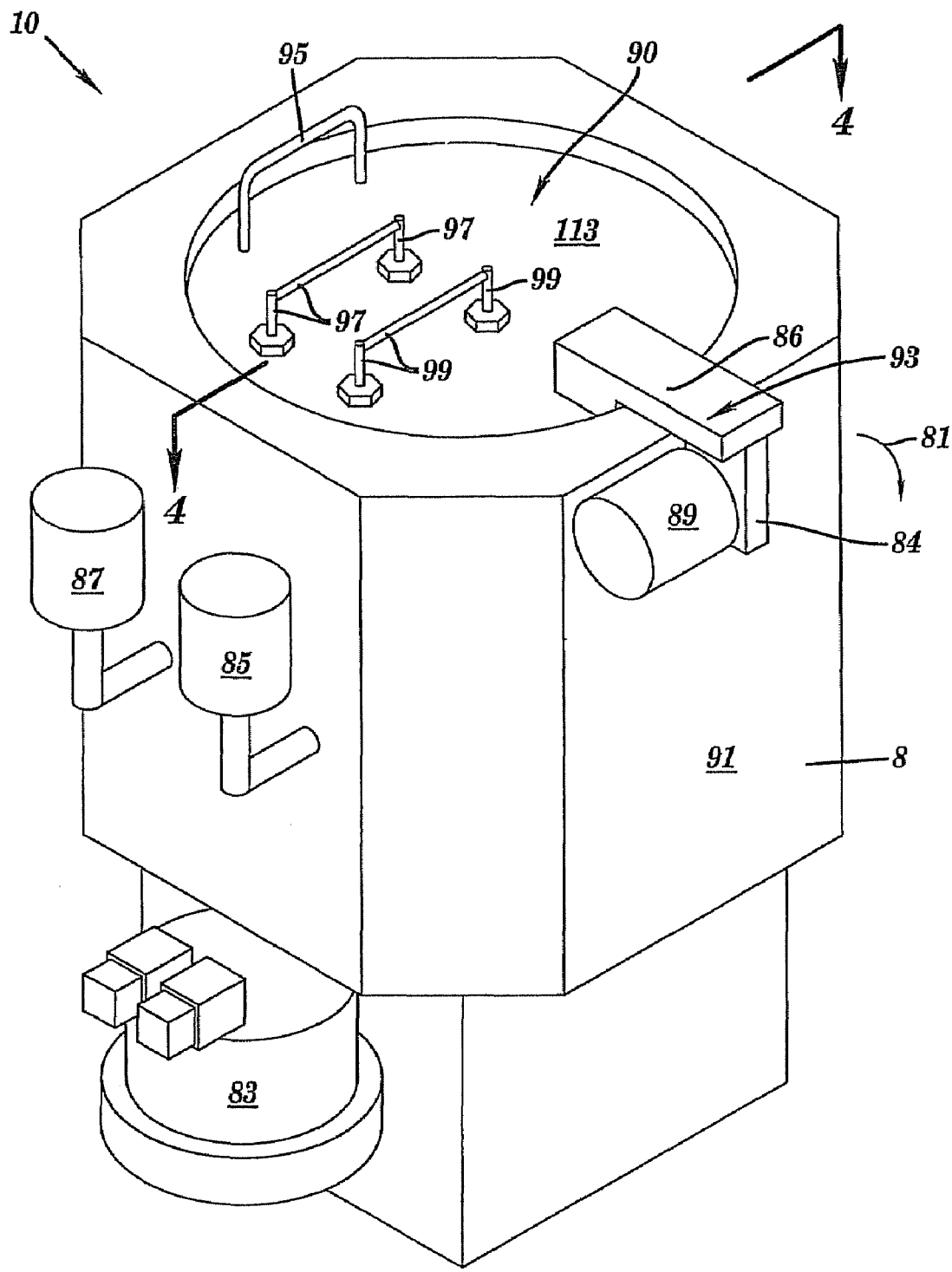
FIG. 1 depicts an exterior view of a single-substrate-processing non-plasma reaction apparatus, according to embodiments of the present invention.

The present invention discloses an apparatus and method that provides controlled etching of an adapted surface layer of a workpiece or wafer by reaction of the adapted surface layer with ammonium bifluoride ($NH_5F_2$), forming a self-limiting etchable layer, ammonium hexafluorosilicate, $(NH_4)_2SiF_6$, that may be removed by thermal desorption. $NH_5F_2$ may be formed by mixing a first fluid, ammonia ($NH_3$) and a second fluid, hydrogen fluoride (HF). The adapted surface layer on the workpiece may comprise an oxide layer, formed by thermal oxidation or tetraethoxysilane (TEOS) oxidation of a portion of the surface of the workpiece or wafer. Etching the adapted surface layer with HF alone to a given thickness is difficult to control because the formation of $SiF_4$ continues until the surface layer, i.e., the oxide layer, has been completely etched due to formation and evaporation of $SiF_4$. Reaction of the adapted surface layer with ($NH_5F_2$) forms the self-limiting etchable layer, $(NH_4)_2SiF_6$, that provides controlled etching of an adapted surface layer of a workpiece or wafer because the self-limiting layer has reduced permeability to HF in the $NH_3$ and HF mixture.

Jeng et al. disclose in commonly assigned U.S. Pat. No. 5,282,925, herein incorporated by reference, a method for formation of a self-limiting etchable layer. Hereinafter, a self-limiting etchable layer includes layers made of materials such as ammonium hexafluorosilicate, $(NH_4)_2SiF_6$, that may become impervious to continued exposure to hydrogen fluoride (HF), resulting in an ability to control an etching thickness. In Jeng et al., a surface layer of a silicon wafer is adapted to being etched by forming an oxide layer such as a silicon dioxide ($SiO_2$) layer on the surface of the wafer. In Jeng et al., a portion of the $SiO_2$ layer becomes a self-limiting etchable layer when the portion of the layer of $SiO_2$ undergoes a non-plasma reaction with ammonium bifluoride ($NH_5F_2$), producing the self-limiting etchable layer of $(NH_4)_2SiF_6$ and a remaining layer of unreacted $SiO_2$. According to Jeng et al., $NH_5F_2$ may be produced by chemical combination of two (2) moles of HF and one (1) mole of ammonia ($NH_3$). Hereinafter, "providing a stoichiometric number of moles of HF to $NH_3$ needed to form ammonium bifluoride ($NH_5F_2$)" or "providing a stoichiometric molar ratio of HF:$NH_3$=2 needed to form $NH_5F_2$" means providing two (2) moles of HF and one (1) mole of ammonia ($NH_3$) to form $NH_5F_2$.

Pure hydrogen fluoride (HF) may etch the adapted surface layer by forming gaseous silicon tetrafluoride ($SiF_4$). The gaseous $SiF_4$ is very volatile such that exposing the surface layer to HF readily etches the surface layer, thereby exposing a remaining layer of oxide to etching by the HF. Etching to the given thickness is difficult to control because the formation of $SiF_4$ continues until the surface layer, i.e., the oxide layer, has been completely etched due to formation and evaporation of $SiF_4$.

According to Jeng et al., the reaction of HF with $SiO_2$ when in contact with condensed ammonium bifluoride ($NH_5F_2$) is similar to the reaction in aqueous solution, $SiO_2+4HF=SiF_4+2H_2O$. However, instead of being released to the solution, the $SiF_4$ product is trapped and reacts within the condensed film to produce $(NH_4)_2SiF_6$. The $(NH_4)_2SiF_6$ is observed in IR spectra of reacted layers. Microbalance results also show the presence of the reacted layer. Condensation of $NH_3$ and HF followed by desorption of the unreacted excess produces a frequency decline of 101 Hz, corresponding to reaction of 84 Å of the several thousand angstrom thick layer of $NH_5F_2$ that initially condensed. After heating to 100° C. there is a 103 Hz increase of resonant frequency corresponding to 58 Å of $SiO_2$ being etched from the adapted surface layer of the silicon wafer.

Thermal desorption spectra are consistent with $SiF_4$ released upon thermal decomposition of the reacted layer of ammonium hexafluorosilicate. The ammonium hexafluorosilicate layer can also be removed by rinsing in a solvent, such as water.

According to Jeng et al., the amount of $SiO_2$ which may be etched may be controlled by providing a stoichiometric number of moles of HF to $NH_3$ needed to form ammonium bifluoride ($NH_5F_2$), i.e. providing a molar ratio of HF to $NH_3$ in the gas above the $SiO_2$ surface substantially equivalent to 2. Pure HF etches $SiO_2$ with no self-limiting process. Ammonia ($NH_3$) is necessary to form the hexafluorosilicate product.

Jeng et al. discloses an apparatus and method in which ammonium bifluoride ($NH_5F_2$) vapors can evaporate from an $NH_5F_2$ effusion cell, leading to a non-stoichiometric $NH_5F_2$ on the adapted surface layer being etched. An object of the present invention is to provide an apparatus and method in which the stoichiometric molar ratio of HF:$NH_3$=2 needed to form $NH_5F_2$ may be substantially uniformly and homogeneously provided on the adapted surface layer being etched.

Figure 2:
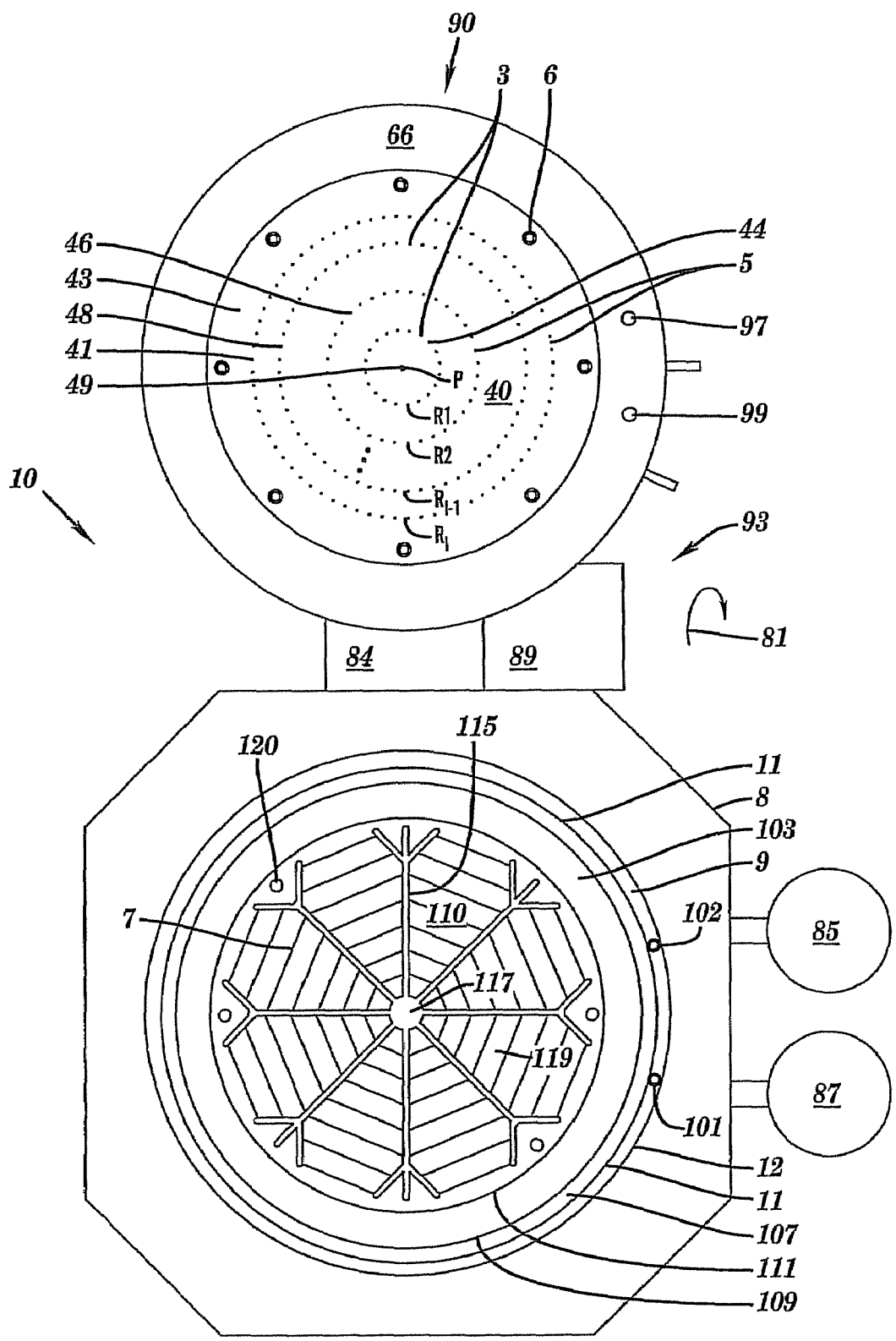
FIG. 2 depicts a top interior view of FIG. 1 after opening a lid of the apparatus and rotating it in a counter-clockwise direction on a longitudinal axis through a center of the apparatus.

In accordance with embodiments of the present invention, FIG. 1 depicts an exterior view of a single-substrate-processing non-plasma reaction apparatus 10, comprising an outer wall 8 of the apparatus 10, an exhaust port 83, dual manometers 85 and 87 and a lid 90. The outer wall 8 of the apparatus 10 may comprise a surface 91. The lid 90 comprises a surface 113 and a handle 95 on the surface 113. The apparatus 10 may further comprise a hinge 93, wherein a portion 89 of the hinge 93 may be coupled to the surface 91 of the outer wall 8, a portion 86 of the hinge 93 may be coupled to the surface 113 of the lid 90, and the portions 89 and 86 may be operatively coupled to a rotating portion 84 of the hinge 93. The rotating portion 84 of the hinge 93 may rotate on an axis parallel to the surface 91 of the wall 8 in a direction of an arrow 81. Referring to FIG. 1, the fluid feed line 99 passes through the lid 90 and extends to a source of first or second fluid (not shown) via a remaining portion of the fluid feed line 99 within the apparatus 10 as depicted in FIG. 2 and described infra. In a like manner, the fluid feed line 97 passes through the lid 90 and described herein and extends to a source of first or second fluid (not shown) via a remaining portion of the fluid feed line 97 within the apparatus 10 as depicted in FIG. 2 and described infra. The manometers 85 and 87 may be used to measure a pressure within the chamber 7 due in part to a flow of the first and second fluids through fluid feed lines 97 and 99. The manometer 85 may have a range from about 0-100 milli torr (mT) and the manometer 87 may have a range from about 0-100 torr. The first fluid may comprise, inter alia, ammonia ($NH_3$) and the second fluid may comprise, inter alia, hydrogen fluoride (HF). The flow of $NH_3$ may be provided to the fluid feed line 97 from about 3 to about 30 sccm at a pressure from about less than 1 psi to about 40 psi, and a flow of the HF may be provided to fluid feed line 99 from about 10 to about 60 sccm at a pressure from about less than 1 psi to about 5 psi. The fluid feed lines 97 and 99 may be alternatively provided with inter alia Argon or $N_2$ gas.

FIG. 2 depicts a top view of FIG. 1 after rotating the apparatus 10 in a counter-clockwise direction on a longitudinal axis through a center of the apparatus 10, such that the hinge 93 may be located at a top back position of the apparatus 10, and after lifting the lid 90 on the hinge 93 of the apparatus 10. Lifting the lid 90, wherein the rotating portion 84 of the hinge 93 was rotated 180 degrees in the direction of the arrow 81, exposed a portion 66 of a surface of the lid 90 that may be opposite and parallel to the surface 113 of the lid 90, as depicted in FIG. 1 and described herein.

The exposed surface 66 of the lid 90 may further comprise portions of the fluid feed lines 97 and 99 that may pass through the lid 90 as depicted in FIG. 1 and described herein. Referring to FIG. 2, a distribution plate 40 having an exposed surface 43 may be operatively coupled to the remaining portion (not shown) of a surface of the lid 90 that may be opposite and parallel to the surface 113 of the lid 90, as depicted in FIG. 1 and described herein. The distribution plate 40 may have been operably coupled to the lid 90 by inserting fasteners through holes 6.

The distribution plate 40 further comprises "I" rings, wherein I is a positive integer greater than or equal to 2, and wherein the rings have been denoted as $R_X$(X=1, 2, ... I−1, I). FIG. 2 shows rings 44, 46, 48, and 41, which are respectively denoted as $R_1$, $R_2$, $R_{I-1}$, and $I_I$. The rings $R_X$(X=1, 2, ..., I−1, I) each have a common point P (i.e. point 49 in FIG. 2) on the surface 43 of the distribution plate 40, wherein P is within each $R_X$ for values of X=1, 2, ..., I−1, I. Each ring $R_X$ is totally within each ring $R_X$+1 for values of X=1, 2, ..., (I−1).

Additionally, each ring $R_X$ has a perimeter of length $D_X$, (X=1, 2, ..., I−1, I), such that $D_1 < D_2 < ..., < D_I$. Corresponding points in rings $R_1, R_2, \ldots, R_I$ are at increasing distance from the common point P. Each ring $R_X$ (X=1, 2, ..., I) has any geometrical shape such as inter alia, a circle, an ellipse, a rectangle or a square, etc.

Each ring of the I rings $R_1, R_2, \ldots, R_I$ in FIG. 2 comprises a distribution of channels 3 of a first type in which the first fluid may flow, or a distribution of channels 5 of a second type in which the second fluid may flow. There are $n_1$ channels 3 of the first type in the I rings collectively, and there are $n_2$ channels 5 of the second type in the I rings collectively. The first fluid from the fluid feed line 97 flows through the $n_1$ channels 3 of the first type, and the second fluid from the fluid feed line 99 flows through the $n_2$ channels 5 of the second type, as will be described infra in conjunction with FIG. 4. A ring that comprises channels 3 of the first type is called a ring of the first type, and a ring that comprises channels 5 of the second type is called a ring of the second type. There are $I_1$ rings of the first type and $I_2$ rings of the second type such that $I_1 \geq 1$, $I_2 \geq 1$, and $I=I_1+I_2$. Thus the $I_1$ rings of the first type collectively comprise the $n_1$ channels 3 of the first type and no channels 5 of the second type, and the $I_2$ rings of the second type collectively comprise the $n_2$ channels 5 of the second type and no channels 3 of the first type. For example, with I=4 assumed, if $I_1=2$ such that the $I_1$ rings comprise rings $R_1$ and $R_3$ respectively having $n_{11}$ and $n_{13}$ channels 3 of the first type then $n_1=n_{11}+n_{13}$, and if $I_2=2$ such that the $I_2$ rings comprise rings $R_2$ and $R_4$ respectively having $n_{22}$ and $n_{24}$ channels 5 of the second type, then $n_2=n_{22}+n_{24}$. The first subscript "1" of $n_{11}$ and $n_{13}$ identifies the channels 3 of the first type and the first subscript "2" of $n_{22}$ and $n_{24}$ identifies the channels 5 of the second type. The second subscripts "1" and "3" of $n_{11}$ and $n_{13}$ identifies the channels 3 of the first type in the rings $R_1$ and $R_3$ respectively. The second subscripts "2" and "4" of $n_{22}$ and $n_{24}$ identifies the channels 5 of the second type in the rings $R_2$ and $R_4$. Hereinafter, in the example with I=4 assumed, if $I_1=2$ such that the $I_1$ rings comprise rings $R_1$ and $R_3$ respectively having $n_{11}$ and $n_{13}$ channels 3 of the first type and if $I_2=2$ such that the $I_2$ rings comprise rings $R_2$ and $R_4$ respectively having $n_{22}$ and $n_{24}$ channels 5 of the second type, then the rings $R_1$, $R_2$, $R_3$ and $R_4$ are "alternating rings." In a general case where I may be a positive integer greater than or equal to 2, assuming $I_1=I_2$ and $I_1+I_2=I$, a number of alternating rings having $n_1$ channels of the first type or $n_2$ channels of the second type is equal to I/2.

The $I_1$ rings of the first type and $I_2$ rings of the second type may be arranged in any order with respect to the common point P. As a first example with I assumed to be even, the $I_1$ rings of the first type and the $I_2$ rings of the second type may alternate such that $I_1=I_2$, wherein the $I_1$ rings of the first type comprise rings $R_1, R_3, \ldots, R_{I-1}$, and wherein the $I_2$ rings of the second type comprise rings $R_2, R_4, \ldots, R_I$. As a second example with I assumed to be odd, the $I_1$ rings of the first type and the $I_2$ rings of the second type may alternate such that $I_1=I_2+1$, wherein the $I_1$ rings of the first type comprise rings $R_1, R_3, \ldots, R_I$, and wherein the $I_2$ rings of the second type comprise $R_2, R_4, \ldots, R_{I-1}$. As a third example with I assumed to be even, the $I_1$ rings of the first type may exist in consecutive rings and the $I_2$ rings of the second type may likewise exist in consecutive rings such that $I_1=I_2$, wherein the $I_1$ rings of the first type comprise rings $R_1, R_2, \ldots, R_{I/2}$, and wherein the $I_2$ rings of the second type $R_{I/2+1}, R_{I/2+2}, \ldots, R_I$. As a fourth example with $I_2$ assumed to be odd, the $I_1$ rings of the first type may exist in consecutive rings and the $I_2$ rings of the second type may likewise exist in consecutive rings such that $I_1=I_2+1$, wherein the $I_1$ rings of the first type comprise rings $R_1, R_2, \ldots, R_{(I+2)/2}$, and wherein the $I_2$ rings of the second type comprise $R_{(I+1)/2+1}, R_{(I+1)/2+2}, \ldots, R_I$. As a fifth example with I assumed to be odd, the $I_1$ rings of the first type may exist in consecutive rings and the $I_2$ rings of the second type may likewise exist in consecutive rings such that $I_1=I_2-1$, wherein the $I_1$ rings of the first type comprise rings $R_1, R_2, \ldots, R_{(I-1)/2}$, and wherein the $I_2$ rings of the second type comprise $R_{(I-1)/2+}, R_{(I-1)/2+2}, \ldots, R_I$.

Letting $N_x$ denote the number of channels in ring $R_x$ (X=1, 2, ..., I), the scope of the present invention comprises several special cases with respect to the number and distribution of channels in each ring. In a first special case, $N_x$ increases monotonically as $D_x$ increases. "Nx increases monotonically as Dx increases" means $N_x$ always increases as $D_x$ increases. In a second special case, $N_x$ increases about linearly as $D_x$ increases. In some embodiments, for example, $N_x$ is in a range of about 20 to about 72. In a third special case, the channels in each ring are approximately uniformly spaced apart. In some embodiments, a spacing between adjacent channels of uniformly spaced channels in a ring may be in a range of, inter alia, about 0.0875 inches to about 0.104 inches.

Referring to FIG. 2, lifting the lid 90, wherein the rotating portion 84 of the hinge 93 (see FIG. 1) was rotated 180 degrees in the direction of the arrow 81, also resulted in exposing a chamber 7 of the apparatus 10. The chamber 7 of the apparatus 10 further comprises a chamber wall 9 having an outer surface 12 and an inner surface 11. A portion 101 of the fluid feed line 97 may be located in the wall 9. The wall 9 may further comprise a portion 102 of the fluid feed line 99.

Referring to FIG. 2, the chamber 7 further comprises an upper annular ring 103 located such that a space or gap 107 exists between an edge 109 of the upper annular ring 103 and the inner surface 11 of the chamber wall 9. The upper annular ring 103 may be made from polytetrafluoroethylene or fluorinated ethylene propylene such as Teflon®, acetal homopolymer resin modified with DuPont™ Kevlar® resin such as Delrin®, polyimide materials such as Vespel® or Altymid®, polyetherimide materials such as Ultem®, polyarylate such as Ardel®, polycarbonate such as Lexan®, hard coated aluminum, stainless steel and combinations thereof. The apparatus 10 further comprises an electrostatic chuck 110, wherein the electrostatic chuck 110 includes a feed line 117 for providing helium gas, grooves or glands 115 for distributing the helium gas, and holes 120 for wafer support pins. The electrostatic chuck 110 is called an electrostatic chuck because it electrostatically clamps onto a silicon wafer. The temperature of the wafer may be maintained from about −10° C. to about 90° C.

Figure 3:
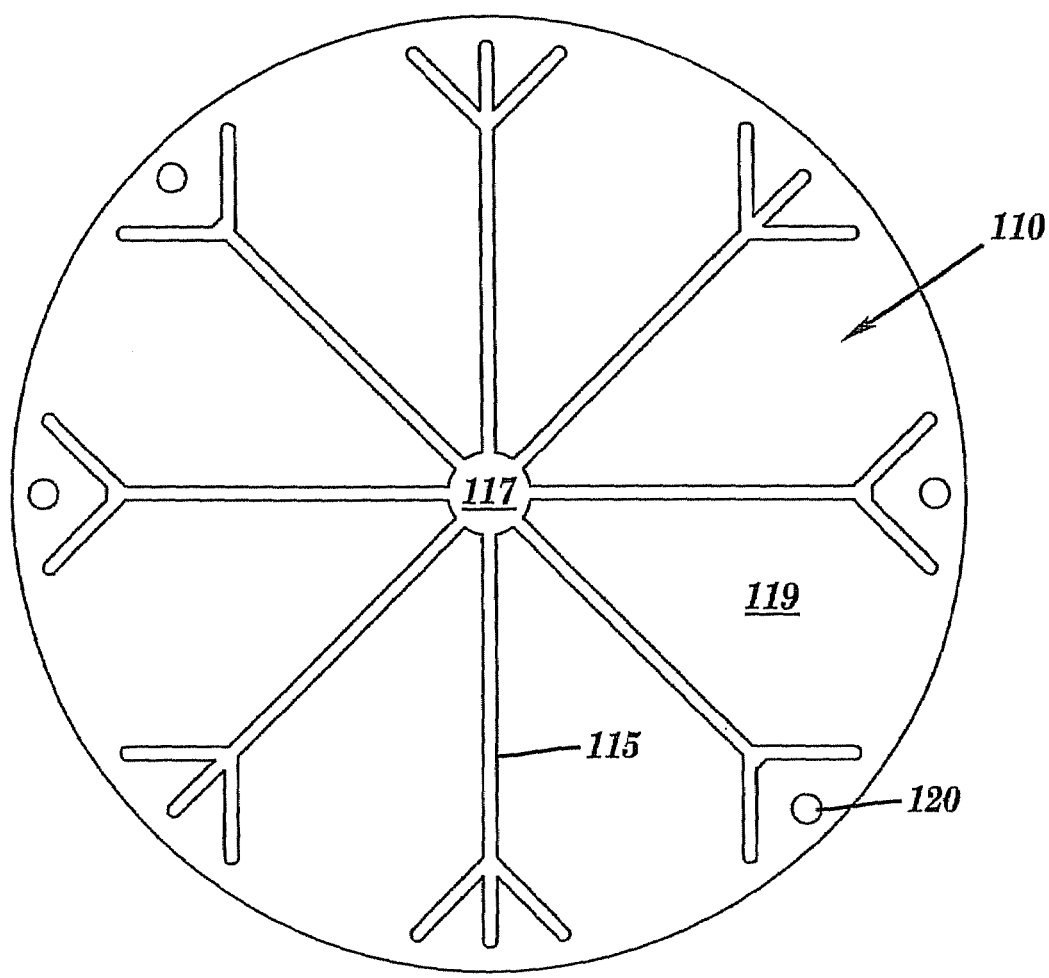
FIG. 3 depicts a top view of an electrostatic chuck of the apparatus.

FIG. 3 depicts a top view of the electrostatic chuck 110 of FIG. 2, further comprising a surface or a sandwich 119 that may include a copper sheath sandwiched between an upper and lower layer of Kapton tape. Alternatively, the tape may be any polyimide tape. Applying a voltage from about 0 to about 2,000 volts DC to the surface or the sandwich 119 may result in coulomb attraction that may attract a wafer to the surface 119. The electrostatic chuck device may be obtained from Applied Materials, Inc., 3050 Bowers Avenue, Santa Clara, Calif. 95054-3299, U.S.A.

Figure 4:
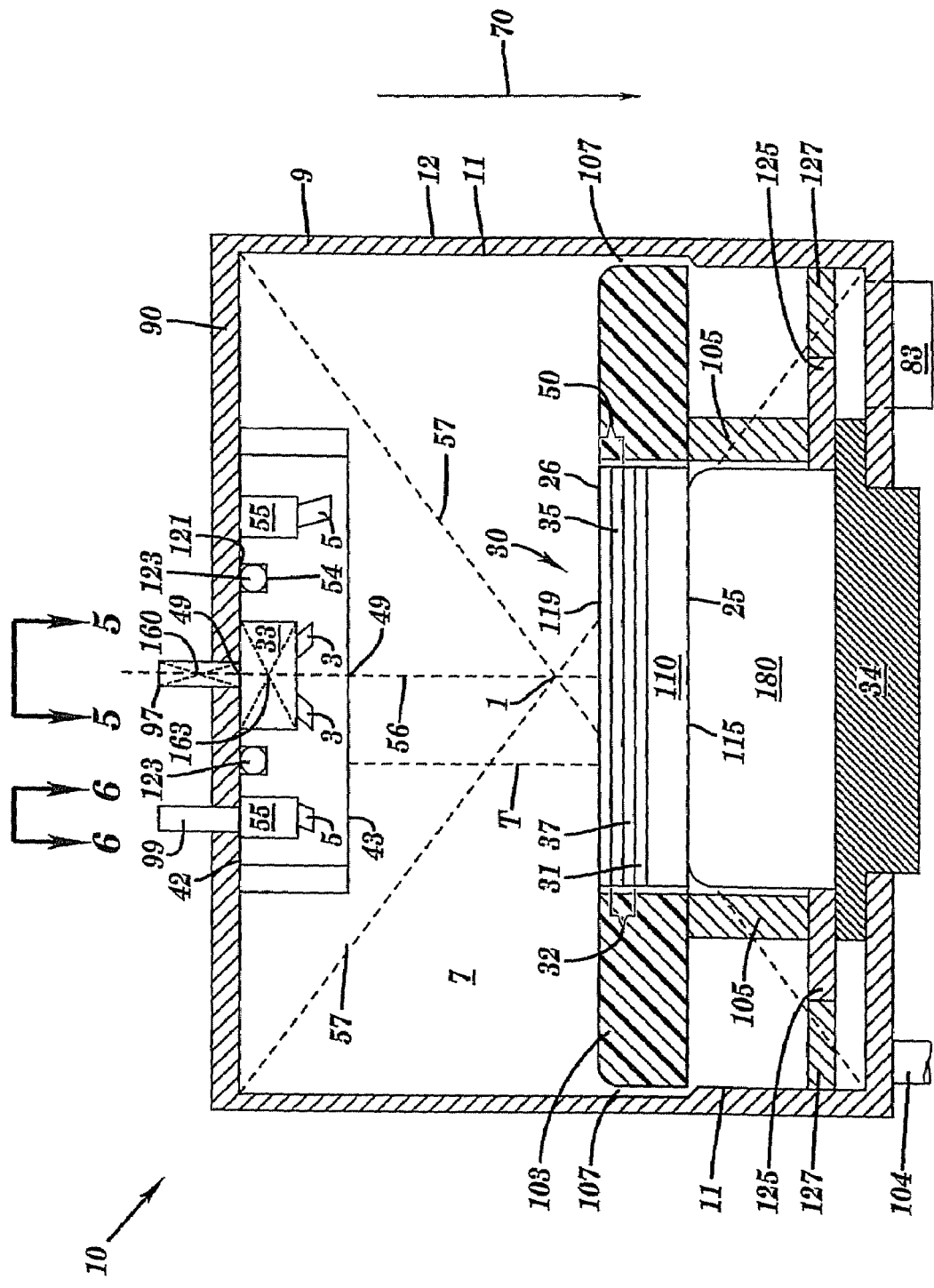
FIG. 4 depicts a longitudinal cross-sectional view taken along line 4-4 of FIG. 1.

FIG. 4 depicts a cross-sectional view taken along line 4-4 of FIG. 1, wherein the apparatus 10 further comprises the distribution plate 40, operatively coupled to the lid 90, wherein the surface 43 of the distribution plate 40 faces away from the lid 90 and the surface 42 of the distribution plate 40 faces toward the lid 90. The distribution plate 40 may be operatively coupled to the lid 90 because the fluid feed line 97 has passed through the surface 113 as depicted in FIG. 1 and described herein, and has been operatively coupled to a cavity or groove 33 abutting the surface 42 of the distribution plate 40, and to the $n_1$ channels 3 of the first type, as depicted in FIG. 2, and described herein. FIG. 4 further depicts the fluid feed line 99 after it has passed through the surface 113 as depicted in FIG. 2 and described herein, and has been operatively coupled to a cavity or groove 55 abutting the surface 42 of the distribution plate 40, and to the $n_2$ channels 5 of the second type, as depicted in FIG. 2, and described herein. The fluid feed line 97 provides the first fluid to the cavity or groove 33 and the $n_1$ channels 3 of the first type and the fluid feed line 99 provides the second fluid to the cavity or groove 55 and the $n_2$ channels 5 of the second type.

The surface 42 of the distribution plate 40 may include a groove 121 between the channels 3 and 5, wherein the groove 121 may further comprise a bottom wall 54, and wherein a depth of the groove 121 from the surface 42 to the bottom wall 54 may be at least 0.078 in. The groove 121 may include an o-ring or equivalent seal 123, wherein the seal 123 may prevent comingling of the first and second fluids in the $n_1$ channels 3 of the first type and the $n_2$ channels 5 of the second type respectively. An objective of the present invention is to have NH3 and HF, inter alia, enter chamber 7 without pre-mixing. O-rings or equivalent seals 123 are used as barriers to prevent the fluids in each ring $R_X$ from mixing. The o-ring or equivalent seals 123 may be made from polytetrafluoroethylene or fluorinated ethylene propylene such as Teflon®, acetal homopolymer resin modified with DuPont™ Kevlar® resin such as Delrin®, polyimide materials such as Vespel® or Altymid®, polyetherimide materials such as Ultem®, polyarylate such as Ardel®, polycarbonate such as Lexan®, and combinations thereof. The first and second fluids may be sent to alternating rings (i.e., the first and second fluids may be sent to rings $R_1, R_3, R_5, \ldots$ and $R_2, R_4, R_6, \ldots$, respectively) so that as the first and second fluids respectively exit the channels 3 and 5 of each ring, there is no comingling of the first and second fluids until they enter the chamber 7 through the channels 3 and 5 of each ring.

The apparatus 10 further comprises a workpiece 30, wherein a portion 32 of the workpiece 30 has been adapted for being etched, and a remaining portion 31 has not been adapted. The workpiece 30 may comprise any semiconductor material such as silicon or germanium. The adapted surface layer 32 may be formed by oxidation of the silicon or germanium using any appropriate method of oxidation. For example, the adapted surface layer 32 of the workpiece 30 may be an oxide formed from tetraethoxysilane (TEOS) or alternatively from thermal oxidation. The workpiece 30 may be held in place by the electrostatic chuck 110.

A self-limiting etchable layer 50, having a surface 26, comprising ammonium hexafluorosilicate (($NH_4)_2SiF_6$), has been formed from a portion of the adapted surface layer 32 of the workpiece 30, wherein a remaining portion 37 of the adapted surface 32 has become impervious to etching by the first or second fluid, such as hydrogen fluoride (HF), because the remaining portion 37 has been protected from the HF by the self-limiting layer 50, as disclosed by Jeng et al. in U.S. Pat. No. 5,282,925, described herein.

A thickness of the self limiting layer 50 may be controlled, wherein a change of 1° in a temperature of the workpiece 30 equals a 17 Å etch rate change/minute, wherein the etch rate is directly proportional to the increase in temperature, in the temperature range from about −10 to about 90° C. A temperature controlling device 180 such as, for example, an aluminum cathode may be provided to maintain the temperature of the workpiece 30 within +/−1° C. in the range from about −10 to about 90° C. The apparatus 10 further comprises a base flange 34 for supporting the temperature controlling device 180. The chamber wall 9 may also be provided with heating or cooling lines 104 to maintain the chamber wall 9 from about −10 to about 90° C.

Prior to forming the self-limiting etchable layer 50, the distribution plate 40 has been aligned over the adapted surface layer 32 of the workpiece 30. Hereinafter, "aligning the distribution plate 40" or "centering the distribution plate 40" or "the distribution plate 40 has been aligned" over the adapted surface layer 32 of the workpiece 30 means the center 163 of the cavity or groove 33, the center point 49 on the surface 43 of the distribution plate 40, the center 1 of the apparatus 10, and the center 165 of the workpiece 30 are located as points on a line 56, wherein the line 56 may be orthogonal to the surfaces 42 and 43 of the distribution plate 40 and the adapted surface layer 32 of the workpiece 30. The center 1 of the chamber 7 may be found at an intersection of transversal lines 57. The center 49 of the surface 43 of the distribution plate 40, and the center 26 of the workpiece 30 may be determined to be at an intersection of the respective transversal lines.

In addition to aligning the distribution plate 40 prior to forming the self-limiting etchable layer 50, the distribution plate 40 may be positioned a distance T from the adapted surface layer 32 of the workpiece 30. In an embodiment of the present invention, the distance T from the surface 26 of the adapted surface layer 32 of the workpiece 30 to the surface 43 of the distribution plate 40 includes from about ⅛ in. to about 3½ in.

The chamber 7 of the apparatus 10 further comprises: the surface or sandwich 119 of the electrostatic chuck 110; the upper annular ring 103; the cathode insulator 105; and the lower annular ring 125, containing a plurality of exhaust holes 127 for distributing an exhaust flow provided by a vacuum pump, such as a turbo pump, through the exhaust port 83. Referring to FIG. 4, in an embodiment of the present invention, an exhaust flow that originates from the exhaust port 83, as depicted in FIG. 1 and described herein, may be distributed through the plurality of exhaust holes 127 of the lower annular ring 125, resulting in a uniform or homogeneous atmosphere of reactive fluids over the workpiece 30 in the chamber 7. Hereinafter, "reactive fluids" include the first fluid, the second fluid, wherein the first or second fluids may be ammonia ($NH_3$) or hydrogen fluoride (HF) and ammonium bifluoride ($NH_5F_2$) and combinations thereof. Providing the reactive fluids over the adapted surface layer 32 of the workpiece 30, as a uniform or homogeneous atmosphere, forms the self-limiting etchable layer 50 that includes layers made of materials such as ammonium hexafluorosilicate (($NH_4)_2SiF_6$), that may become impervious to continued exposure to hydrogen fluoride (HF). Such imperviousness is the basis for the layer 50 being a self-limiting etchable layer. When the exhaust flow from the exhaust port 83 is distributed through the plurality of holes 127 in the lower annular ring 125, instead of through a single exhaust port, it was determined that a pressure of at least 4 torr may be provided without causing a concentration gradient of the fluids in the atmosphere, as may result if the lower annular ring 125 consisted of a single port, because the self-limiting etchable layer 50 had a uniform thickness. In another embodiment, providing the space or gap 107 between the upper annular ring 103 and the inner surface 11 of the chamber wall 9 restricted the exhaust flow from the exhaust port 83 and increased a concentration of the reactive fluids over the adapted surface layer 32, such that a change of 1° C. equals a 17 Å of etch rate change/minute, when the workpiece 30 was maintained at a temperature from about −10 to about 90° C., and while operating at a pressure of at least 4 torr. In some embodiments, for example, the space or gap 107 may be a distance from the edge 109 of the upper annular ring 103 to the inner surface 11 of the chamber wall 9 and may be at least ⅜ in. Referring to FIGS. 3 and 4, the workpiece 30 may be supported by lift pins that may be inserted through holes 120 of the surface 119 of the electrostatic chuck 110. The distribution plate 40, the o-rings 123, the upper annular ring 103, the cathode insulator 105 and lower annular ring 125 may be made from polytetrafluoroethylene or fluorinated ethylene propylene such as Teflon®, acetal homopolymer resin modified with DuPont™ Kevlar® resin such as Delrin®, polyimide materials such as Vespel® or Altymid®, polyetherimide materials such as Ultem®, polyarylate such as Ardel®, polycarbonate such as Lexan®, and combinations thereof.

Figure 5:
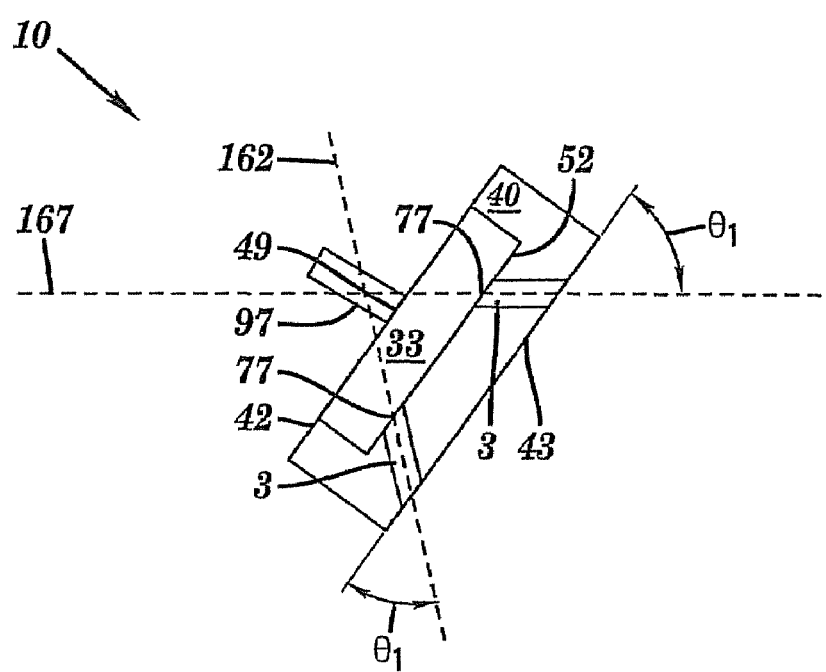
FIG. 5 depicts a cross-sectional view taken along line 5-5 of FIG. 4 of a center portion of a distribution plate.

FIG. 5 depicts a cross-sectional view taken along line 5-5 of FIG. 4 of a center portion of the distribution plate 40 in which the cavity or groove 33 and the $n_1$ channels 3 of the first type in the distribution plate 40 are substantially in the same plane. The $n_1$ channels 3 of the first type have been adapted to provide a line or path 162 or 167 for a first fluid to flow from the surface 43 of the distribution plate 40 at an angle $\theta_1$ with respect to the surface 43, wherein angle $\theta_1$ is at least 45 degrees and less than 90 degrees. The $n_1$ channels 3 of the first type have been adapted to provide a line or path 162 or a line or path 167 for a first fluid to flow from the surface 43 of the distribution plate 40 at the angle $\theta_1$. The first fluid flows through the $n_1$ channels 3 of the first type along the line or path 162 or the line or path 167 drawn through a center 77 of the $n_1$ channels 3 of the first type.

Figure 6A:
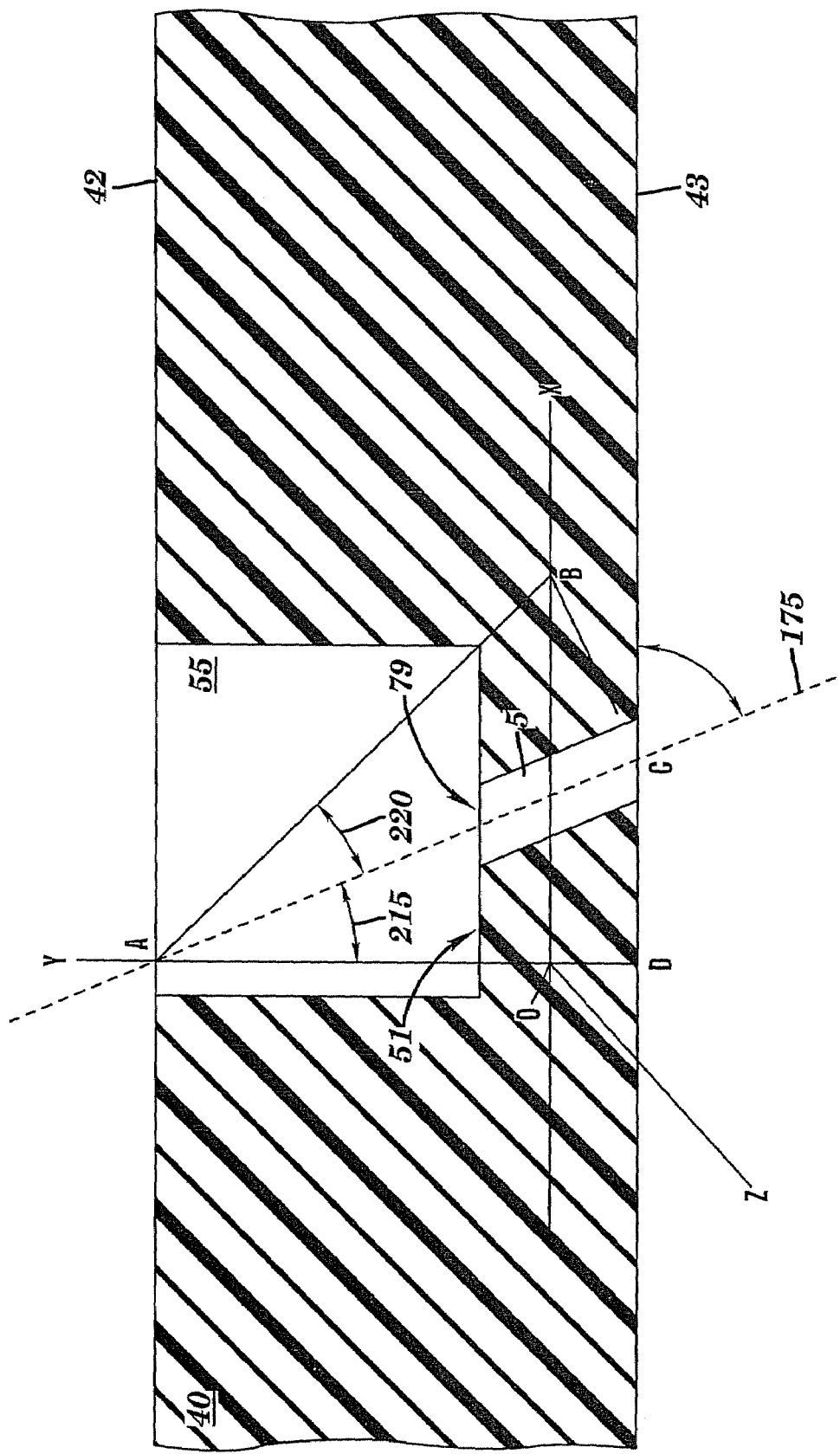
FIG. 6A depicts a cross-sectional view taken along line 6-6 of FIG. 4 of a portion of the distribution plate.
Figure 6B:
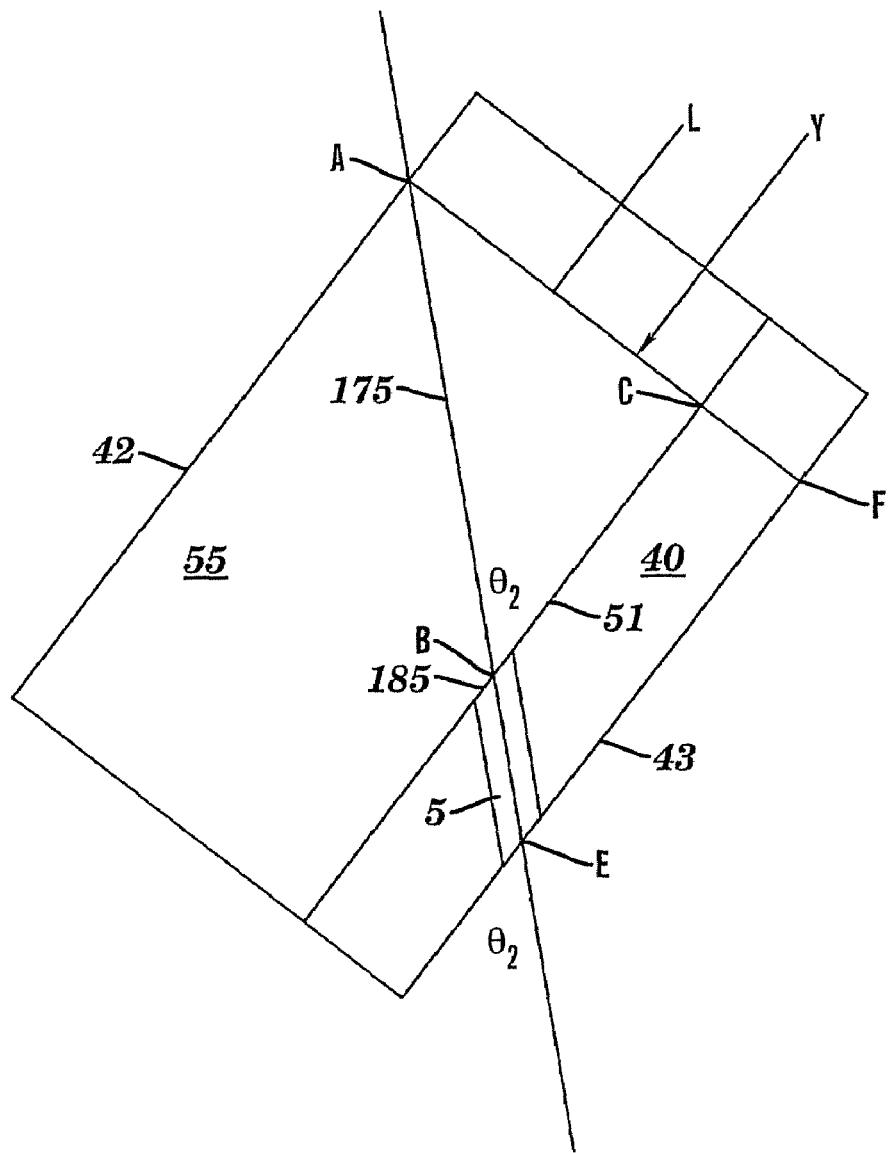
FIG. 6B depicts FIG. 6A, wherein three dimensional XYZ axes are superimposed on the cross-sectional view depicted by FIG. 6A, taken along line 6-6 of FIG. 4.

FIG. 6B depicts a cross-sectional view taken along line 6-6 of FIG. 4 of a portion of the distribution plate 40 in which the cavity or groove 55 and the $n_2$ channels 5 of the second type in the distribution plate 40 are substantially in the same plane. The $n_2$ channels 5 of the second type have been adapted to provide a line or path 175 for a second fluid to flow from the surface 43 of the distribution plate 40 at an angle $\theta_2$ with respect to the surface 43, wherein $\theta_2$ is at least 45 degrees and less than 90 degrees. The $n_2$ channels 5 of the second type have been adapted to provide a line or path 175 for a second fluid to flow from the surface 43 of the distribution plate 40 at the angle $\theta_2$. The second fluid flows through the $n_2$ channels 5 of the second type along the line or path 175 drawn through the center 79 of the $n_2$ channels 5. The angle $\theta_1$. (see FIG. 5) may be greater or less than $\theta_2$ or the angle $\theta_1$ may be substantially equal to $\theta_2$.

FIG. 6A depicts FIG. 6B, wherein three dimensional XYZ axes are superimposed on the cross-sectional view depicted by FIG. 6B, taken along line 6-6 of FIG. 4. The cross-sectional view is a view of the distribution plate 40, wherein an X axis is parallel to the surfaces 42 and 43 of the distribution plate 40, a Y axis is perpendicular to the X axis in the same plane as the X axis, and a Z axis, orthogonal to the X and Y axes and to the cross-sectional view of the distribution plate 40. The right triangle ABO is in the XY plane. The line AB of the right triangle ABC is also in the XY plane. However, the line or path 175 drawn through the center 79 of the $n_2$ channels 5 of the second type may be offset by an angle DAC 215 equal to $\alpha_2$ with respect to the plane XY as it exits the surface 43 of the channels 5. The same line or path 175 drawn through the center 79 of $n_2$ channels 5 of the second type may be offset by an angle BAC 220 equal to $\beta_2$ with respect to the XY plane. The offset angles $\alpha_2$ and $\beta_2$ with respect to (he plane XY may be from about 0 to −45 and about 0 to +45 degrees with respect to the XY plane of the cross-sectional view.

Alternatively, by analogy to offsetting the line or path 175 drawn through the center 79 of the $n_2$ channels 5 of the second type by the angle DAC 215 equal to $\alpha_2$ with respect to the plane XY as it exits the surface 43 of the channels 5 as in FIG. 6A, supra, referring to FIG. 5, the line or path 162 drawn through the center 77 of the $n_1$ channels 3 of the first type may be offset by an angle equal to $\alpha_1$ by analogy to the angle DAC 215 with respect to the XY plane, as depicted in FIG. 6A. The same line or path 162 drawn through the center 77 of $n_1$ channels 3 of the first type may be offset by an angle equal to $\beta_1$ by analogy to the angle BAC 220 with respect to the XY plane, as depicted in FIG. 6A. The offset angles $\alpha_1$ and $\beta_1$ with respect to the plane XY may be from about 0 to −45 and about 0 to +45 degrees with respect to the XY plane of the cross-sectional view.

Referring to FIGS. 5 and 6B, offsetting the angle $\theta_1$ by $\alpha_1$ and $\beta_1$ and the angle $\theta_2$ by $\alpha_2$ and $\beta_2$ respectively, increase mixing of the first and second fluids after they have been introduced into the chamber 7, as depicted in FIG. 4 and described herein. Referring to FIG. 4, a flow distribution pattern of fluids from channels 3 and 5 may flow from the surface 43 through the space or gap 107 and exhaust holes 127. In theory, the flow pattern forms a vortex flow distribution which further increases mixing of the two fluids. Referring to FIGS. 5 and 6B, it has been determined that a more uniform thickness of the self-limiting layer 50 resulted when the lines or paths 162, 167 and 175 have been directed at angles $\theta_1$ or $\theta_2$ that may be at least 45 degrees and less than 90 degrees with respect to the surface 43, wherein the angle $\theta_1$ has been offset by $\alpha_1$ and $\beta_1$ or the angle $\theta_2$ has been offset by $\alpha_2$ and $\beta_1$, than if the lines or paths 162, 167 and 175 have been directed orthogonal to the surface 43.

Referring to FIG. 4, the cavity or groove 33 and the $n_1$ channels 3 of the first type and cavity or groove 55 and the $n_2$ channels 5 of the second type may be formed in the distribution plate 40, such as by mechanical drilling, laser drilling or a chemical process.

Referring to FIGS. 5 and 6B, the flow rate (F) of the first or second fluid through the $n_1$ channels 3 of the first type and the $n_2$ channels 5 of the second type may be proportional to factors such as the pressure of the first and second fluids, the pressure (vacuum) in the chamber, described herein in text associated with FIG. 2. In addition it may be determined that F is inversely proportional to a volume (V) of the $n_1$ channels 3 of the first type or the $n_2$ channels 5 of the second type. The inversely proportional relationship between F and V of the channels 3 and 5 may be expressed by the following formula 1:

$$F = 1/V \qquad\qquad 1.$$

V may be calculated if the channels 3 and 5 are cylindrical, wherein $V = \pi R^2 H$ wherein $2R_3$=a diameter ($D_3$) of the $n_1$ channels 3 of the first type or $2R_5$=a diameter ($D_5$) of the $n_2$ channels 5 of the second type and wherein H is equal to a height of the cylinder. The inversely proportional relationship between F and D, and H of the channels 3 and 5 may be expressed by the following formula 1:

$$F = 4/(\pi D^2 H_v) \qquad\qquad 2.$$

Referring to FIG. 6B, the channels 5 may be cylindrical, having a diameter $D_5$ and a height $H_5$ described by the length of a portion BE of the line or path 175. By analogy the channels 3 in FIG. 5 may also be cylindrical, having a diameter $D_3$ and a height $H_3$. The flow rate (F) through the channels 3 or 5 will be inversely proportional to $D_2$ and $H_X$ (where X=3 or 5), according to Formula 2.

Referring to a right triangle AFE and a right triangle ACB in FIG. 6B, $H_5$ of the channels 5 (or $H_3$ of the channels 3, by analogy) is a portion BE of a hypotenuse AE of the triangle AFE when the channels 5 start at the bottom 51 of the cavity or groove 55 and $H_5$ is the hypotenuse AE of the triangle AFE when the channels 5 extend from the surface 42 to the surface 43 of the distribution plate 40. Referring to Formula 2 supra wherein F is inversely proportional to $H_x$, a ratio AE/BE is an increased flow factor because flow may increase when BE decreases. A ratio of AB/AE=AC/AF may be determined because a sine of the angle $\theta_2$ is equal to AF/AE and a sine of the angle $\theta_2$ is also equal to AC/AB. AC may be a length from the surface 42 to the bottom 51 of the cavity or groove 55. AF may be a thickness of the distribution plate 40. Since AE=AB+BE, AB=AE−BE. Substituting for AB in the equality AB/AE=AC/AF, (AE−BE)/AE=AC/AF. Factoring out AE from the left side of (AE−BE)/AE=AC/AF results in (1−BE/AE)=AC/AF, therefore BE/AE=AC/AF+1. It may be determined that a portion BE of the line or path 175 for the second fluid to flow from the bottom 51 of the cavity or groove 55 of the distribution plate 40 to the surface 43 of the distribution plate 40 at the angle $\theta_2$ is a portion of a hypotenuse AE of the right triangle AFE. It may also be determined that a portion AB of the line or path 175 would be the line or path 175 for the second fluid to flow from the surface 42 of the distribution plate 40 to the channel 5 absent the cavity or groove 55. Therefore trigonometry may be used to determine a relationship between the flow of the first or second fluids through the channels 5 (and by analogy, through the channels 3), a depth of the cavity or groove 55, and the angle θ.

In FIG. 6B, a triangle AFE has been formed by lines AF, FE and AE that includes a triangle ACB that has been formed by lines AC, CB, and BA. Line AF is a thickness of the distribution plate 40, line FE is a portion of the surface 43 of the distribution plate 40, and line AE is a length ($H_T$) of channel 5 that the first or second fluids would T have to traverse absent cavity or groove 55. Line AB is a length ($H_A$) of channel 5 that the first or second fluids will not have to traverse because of the cavity or groove 55. Line AC is a depth of the cavity or groove 55 equal to a length (L) from the surface 42 to the bottom 51 of the cavity or groove 55. Line AF is a thickness (Y) of the distribution plate, i.e., an orthogonal length from the surface 42 to the surface 43 of the distribution plate 40.

In embodiments of the present invention, referring to Formulas 1 and 2 and FIGS. 5 and 6B, a diameter ($D_G$) of the cavities or grooves 33 and 55 may be greater than a diameter ($D_C$) of the channels 3 and 5, such that a volume VG of the cavities or grooves 33 and 55 may be greater than a volume $V_C$ of the channels 3 and 5, such that a ratio of $V_G/V_C$ is greater than 1. In an embodiment, for example, a depth of the cavity or groove 55 (or by analogy, a depth of the cavity or groove 33 depicted in FIG. 5) from the surface 42 of the distribution plate 40 to a bottom wall 51 may be from about 0.3 to about 1.3 in., and a diameter ($D_C$) of the $n_1$ channels 3 of the first type may be at least $30/1000$ in.

Figure 7:
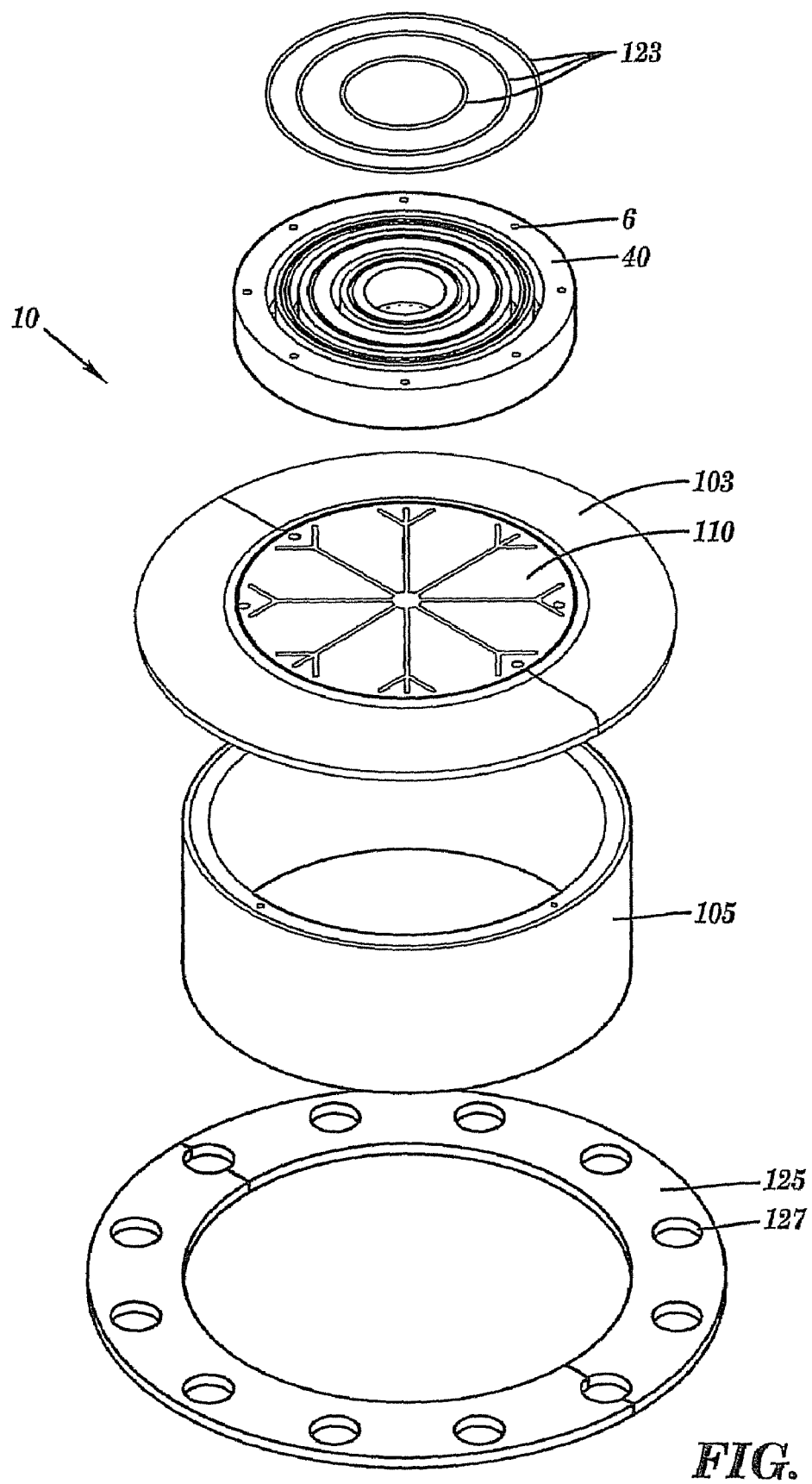
FIG. 7 depicts an exploded frontal interior view of the apparatus.

FIG. 7 depicts an exploded frontal interior view of the apparatus 10 of FIG. 1, and comprises: o-rings 123 that provide a seal to prevent comingling of the $n_1$ channels 3 of the first type and $n_2$ channels 5 of the second type; the distribution plate 40, the electrostatic chuck 110, the upper baffle 103, the cathode insulator 105, and a lower annular ring 125, containing a plurality of exhaust holes 127 for distributing the exhaust flow provided by the exhaust port 83. Referring to FIG. 4, in an embodiment of the present invention, an exhaust flow that originates from the exhaust port 83 may be distributed through the plurality of exhaust holes 127 of the lower annular ring 125, resulting in a uniform or homogeneous atmosphere of reactive fluids over the workpiece 30 in the chamber 7. Hereinafter, "reactive fluids" include the first fluid, the second fluid, wherein the first or second fluids may be ammonia ($NH_3$) or hydrogen fluoride (HF) and ammonium bifluoride ($NH_5F_2$) and combinations thereof. Providing the reactive fluids over the workpiece 30, having the adapted surface layer 32, as a uniform or homogeneous atmosphere forms the self-limiting etchable layer 50 that includes layers made of materials such as ammonium hexafluorosilicate, $(NH_4)_2SiF_6$, that may become impervious to continued exposure to hydrogen fluoride (HF). Such imperviousness is the basis for terming the layer 50 a self-limiting etchable layer. When the exhaust flow from the exhaust port 83 is distributed through the plurality of holes 127 in the lower annular ring 125, instead of through a single exhaust port 83, a pressure of at least 4 torr may be provided without causing a concentration gradient of the fluids in the atmosphere, as may result if the lower annular ring 125 consisted of a single port. In another embodiment, the space or gap 107 exists between the upper annular ring 103 and the inner surface 11 of the chamber wall 9. A purpose of the space or gap 107 between the upper annular ring 103 and the inner chamber wall 11 is to act as a restriction in the exhaust flow, such that a concentration of the reactive fluids may be increased, while operating at a pressure of at least 4 torr. In some embodiments, for example, the space or gap 107 may be at least ⅜ in. The distribution plate 40, the O-rings 123, the upper annular ring 103, the cathode insulator 105 and lower annular ring 125 may be made from polytetrafluoroethylene or fluorinated ethylene propylene such as Teflon®, acetal homopolymer resin modified with DuPont™ Kevlar®, resin such as Delrin®, polyimide materials such as Vespel® or Altymid®, polyetherimide materials such as Ultem®, polyarylate such as Ardel®, polycarbonate such as Lexan®, and combinations thereof.

Figure 8:
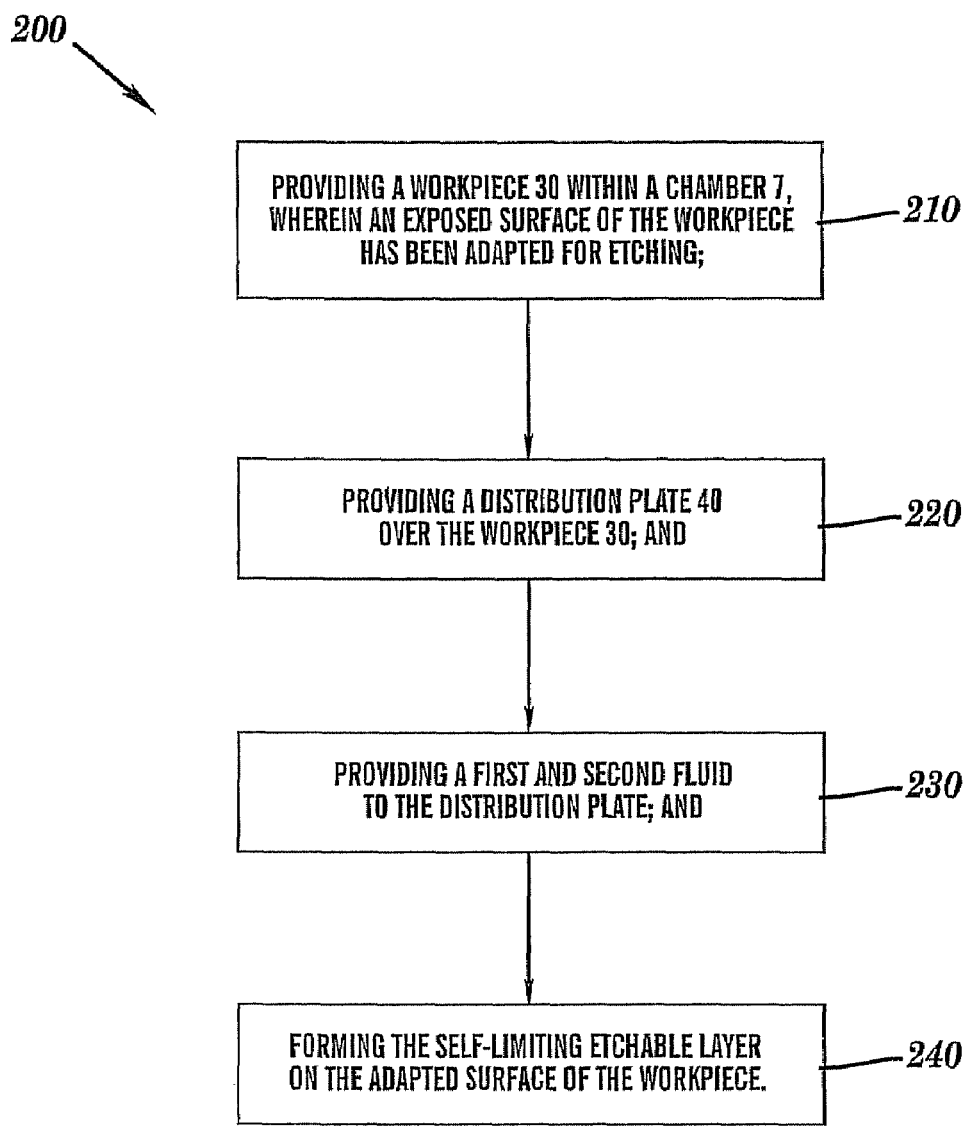
FIG. 8 depicts a method for forming a self-limiting etchable layer, according to embodiments of the present invention.

FIG. 8 depicts a method 200 for forming a self-limiting etchable layer 50 as in FIG. 4, wherein the self-limiting etchable layer 50 may be formed by reacting the oxide coating such as silicon dioxide or germanium dioxide with a first fluid NH3 and a second fluid HF. Jeng et al. disclosed in U.S. Pat. No. 5,282,925, herein incorporated by reference, that when the first and second fluids are $NH_3$ and HF, the self-limiting etchable layer may be ammonium hexafluorosilicate. According to embodiments of the present invention, an average 1 sigma uniformity in a thickness of the self-limiting etchable layer 50 is 1.2%, compared to an average 1 sigma uniformity in a thickness of the self-limiting etchable layer of 1.7% using the method and apparatus of Jeng et al. The average 1 sigma uniformity is defined as one (1) standard deviation of a mean thickness of the layer 50, expressed as a percent of the mean thickness. Further, a 20% improvement in process pressure range is obtained in the present invention compared to the method and apparatus of Jeng et al. Using the same measurement tool, the same monitors and substantially similar process conditions, the average 1 sigma uniformity of a 166.14 Å self-limiting etchable layer 50 is substantially 0.84% using the apparatus 10, as depicted herein and the method 200 of the present invention, compared to the average 1 sigma uniformity of a 95.5 Å self-limiting etchable layer 50 is substantially 1.4% using the method and apparatus of Jeng et al.

Referring to FIG. 8, the method 200 comprises the steps 210, 220, 230, and 240. Step 210 provides a workpiece 30 within a chamber 7, wherein a surface layer of the workpiece 30 has been adapted for being etched. Step 220 provides a distribution plate 40 over the workpiece 30, wherein the distribution plate 40 includes $n_1$ channels 3 of a first type and n2 channels 5 of a second type, wherein the channels 3 of the first type have been adapted to provide a path for a first fluid to flow into the chamber at an angle $\theta_1$ with respect to an exposed surface 43 of the distribution plate 40, wherein the channels 5 of the second type have been adapted to provide a path for a second fluid to flow into the chamber 7 at an angle $\theta_2$ with respect to the exposed surface 43 of the distribution plate 40, wherein the channels 3 of the first type and the channels 5 of the second type may be arranged in alternating rings 44, 46, 48, and 41 around a center of the distribution plate 40, as depicted in FIG. 2 and described in associated text supra, and wherein each angle $\theta_1$ and $\theta_2$ is equal to 45 degrees and less than 90 degrees. Step 230 provides a first and second fluid to the distribution plate. Step 240 forms the self-limiting etchable layer 50 on the workpiece 30 as depicted in FIGS. 4-7 and described in associated text supra. Reaction of the $NH_5F_2$ with a portion 35 of the adapted surface layer 32 formed a self-limiting etchable layer 50 of ammonium hexafluorosilicate on the workpiece 30, wherein a thickness of the self-limiting layer 50 was at least two-fold or at least twice as thick as the portion 35 of the adapted surface layer 32 from which portion 35 of the self-limiting layer 50 was made. In some embodiments of the present invention, the thickness of the self-limiting etchable layer 50 was from about 100 to about 300 Å.

Described herein is an apparatus 10 as depicted in FIGS. 1-7 and described in associated text supra for rapid delivery and homogeneous mixing of $NH_3$ and HF gas with the option of an elevated substrate temperature, in accordance with the method 200 as depicted in FIG. 8 and described in associated text supra.

EXAMPLE 1

Referring to FIG. 8, the following experiment was performed in accordance with the method 200.

Step 210, providing a workpiece 30 within a chamber 7, wherein a surface layer 32 of the workpiece 30 has been adapted for being etched, as in FIG. 4:

A. Referring to FIG. 4, a workpiece 30 having a surface layer 32 that had been adapted for being etched was provided in the apparatus 10. The workpiece 30 was electrostatically held in place on a surface 119 of an electrostatic chuck 110. A polytetrafluoroethylene cathode insulator 105 was wrapped around the cathode 180. The polytetrafluoroethylene of the cathode insulator 105 was at least about ½ inch thick and insulated the cathode 180 to maintain a constant temperature of the workpiece 30 to within +/−1° C. in a temperature range from about −10 to about 90° C.

Step 220, providing a distribution plate 40 over the workpiece 30:

A. Referring to FIG. 4, a distribution plate 40 was provided such that the distribution plate 40 was aligned over the workpiece 30. The distance separating the surface 43 of the distribution plate 40 and the adapted surface layer 32 of the workpiece 30 was ⅔⁄₈ inches. Referring to FIG. 2, the distribution plate 40 included the rings 44, 46, 48, and 41, wherein the first ring 44 from the center point 49 included 20 channels 3, the second ring 46 from the center point 49 included 36 channels 5, the third ring 48 from the center point 49 included 60 channels 3, and the fourth ring 42 from the center point 49 included 72 channels 5. The channels 3 were adapted to provide a path for $NH_3$ to flow into the chamber 7 at an angle $\theta_1$=45 degrees with respect to an exposed surface 43 of the distribution plate 40. The channels 5 were adapted to provide a path for a HF to flow into the chamber at an angle $\theta_2$ 45 degrees with respect to the exposed surface 43 of the distribution plate 40. The channels 3 and 5 were arranged in alternating rings around the center 49 of the distribution plate 40.

Step 230 providing a first and second fluid to the distribution plate 40:

A. A thickness of the self-limiting etchable layer 50 was controlled by varying the temperature of the workpiece 30, resulting in controlling a reaction temperature between the HF and $NH_3$, or by altering the $HF:NH_3$ stoichiometry. It was determined that a change of 1° C. equals 17 Å of etch rate change/minute, when the workpiece 30 was maintained at a temperature from about −10 to about 90° C., as described in step 210 infra.

B. Referring to FIG. 4, providing a vacuum from 1 to about 100 ml from exhaust port 83 to the lower annular ring 125, containing the plurality of exhaust holes 127 for distributing the vacuum and providing chamber 7 with a flow of $NH_3$ and HF from the channels 3 and 5 of the distribution plate 40 resulted in a vapor pressure of at least 4 torr. The flow of $NH_3$ was provided in a range of from about 3 to about 30 sccm from fluid line 97, and a flow of the HF was provided in a range from about 10 to about 60 sccm from fluid line 99. Referring to FIG. 4, the chamber 7 may optionally be provided with Argon or $N_2$ gas from about 0 to about 100 sscm from the lines 97 and 99.

Step 240, forming the self-limiting etchable layer 50 on the workpiece 30:

A. Referring to FIG. 4, a mixing was created as the $NH_3$ and HF enter the chamber 7 from the channels 3 and 5 and are pulled toward the exhaust holes 127 of the lower annular ring 125. The mixing was accomplished by directing the NH3 and HF at angles $\theta_1$ or $\theta_2$ with respect to the exposed surface 43 of the distribution plate 40, wherein angles $\theta_1$ or $\theta_2$ were at least 45 degrees and less than 90 degrees. Providing a vapor pressure of the HF and $NH_3$ of at least 4 torr as in step 230 provided a stoichiometric amount of HF to $NH_3$, substantially equal to 2, that resulted in formation of ammonium bifluoride ($NH_5F_2$) in the chamber 7 over the adapted surface layer 32 of the workpiece 30. Reaction of the $NH_5F_2$ with a portion 35 of the adapted surface layer 32 formed a self-limiting etchable layer 50 of ammonium hexafluorosilicate on the workpiece 30, wherein a thickness of the self-limiting layer 50 was at least two-fold or at least twice as thick as the portion 35 of the adapted surface layer 32 from which portion 35 the self-limiting layer 50 was made. In some embodiments of the present invention, the thickness of the self-limiting etchable layer 50 was from about 100 to about 300 Å.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. An apparatus comprising:

a chamber adapted for holding a workpiece having a surface layer adapted for being etched;

a distribution plate including I rings within the distribution plate and around a common point on the distribution plate such that no other ring exists within the distribution plate, wherein each ring of the I rings is formed within a corresponding groove in the distribution plate such that each ring is the only ring within its corresponding groove;

wherein I is an integer of at least 2, wherein the I rings are denoted as $R_1, R_2, \ldots, R_I$ in order of increasing distance from the common point and consist of $I_1$ rings of a first type and $I_2$ rings of a second type such that $I_1$ is at least 1, $I_2$ is at least 1, and $I_1+I_2=I$, wherein the I rings collectively comprise N channels and no other channels such that each ring of the I rings comprises at least 2 channels of the N channels and no other channels, wherein a flow inlet of each channel of the at least 2 channels of each ring are positioned at a same constant distance from the common point, wherein N is at least 2*I, wherein the N channels consist of $N_1$ channels of a first kind within the $I_1$ rings of the first type and $N_2$ channels of a second kind within the $I_2$ rings of the second type such that $N_1+N_2=N$, wherein each channel of the $N_1$ channels of a first kind is oriented at a same constant angle $\theta_1$ with respect to an exposed surface of the distribution plate and provides a first fluid to flow into the chamber at the same constant angle $\theta_1$ with respect to the exposed surface of the distribution plate, wherein each channel of the $N_2$ channels of the second kind is oriented at a same constant angle $\theta_2$ with respect to the exposed surface of the distribution plate and provides a second fluid to flow into the chamber at the same constant angle $\theta_2$ with respect to the exposed surface of the distribution plate, wherein $\theta_1$ and $\theta_2$ are each at least 45 degrees and less than 90 degrees, wherein $\theta_1$ is unequal to $\theta_2$, and wherein the first fluid differs from the second fluid;

a first fluid feed line connected to a source of the first fluid, wherein the first fluid feed line is fluidically coupled to the $N_1$ channels of the first kind for providing the first fluid to the $N_1$ channels of the first kind, and wherein the first fluid feed line is not fluidically coupled to the $N_2$ channels of the second kind and cannot provide the first fluid to the $N_2$ channels of the second kind; and a second fluid feed line connected to a source of the second fluid and to be fluidically coupled to the $N_2$ channels of the second kind so as to provide the second fluid to the $N_2$ channels of the second kind, and wherein the second fluid feed line is not fluidically coupled to the $N_1$ channels of the first kind and cannot provide the second fluid to the $N_1$ channels of the first kind.

2. The apparatus of claim 1, wherein paths of the $N_1$ channels and paths of the $N_2$ channels originate in an XY plane of the distribution plate and wherein each angle $\theta_1$ and $\theta_2$ is at least 45 degrees and less than 90 degrees with respect to the XY plane and wherein each angle $\theta_2$ is offset from the XY plane at an offset angle $\alpha_1$ and $\beta_1$ with respect to the XY plane, and wherein each angle $\theta_2$ is offset from the XY plane at an offset angle $\alpha_2$ and $\beta_2$ with respect to the XY plane, and wherein $\alpha_1$, $\beta_1$, $\alpha_2$, and $\beta_2$ are selected from the group consisting of from about 0 to −45 and from about 0 to +45 degrees with respect to the XY plane.

3. The apparatus of claim 1, wherein the distribution plate comprises a material selected from the group consisting of polytetrafluoroethylene, fluorinated ethylene propylene, acetyl homopolymer resin, polyimide, polyetherimide, polyarylate, polycarbonate, and combinations thereof.

4. The apparatus of claim 1, wherein a volume of the grooves is greater than a volume of the channels.

5. The apparatus of claim 1, wherein the chamber further comprises a lower annular ring that includes a plurality of holes extending over an exhaust port.

6. The apparatus of claim 1, wherein the chamber further comprises an upper annular ring, wherein a space is created between an edge of the upper annular ring and a wall of the chamber, and wherein the space restricts a flow of fluids in the chamber.

7. The apparatus of claim 1, wherein the distribution plate is located from about ⅛ inch to about 3⅓ inches from a surface of the workpiece.

8. The apparatus of claim 1, wherein the first fluid comprises ammonia gas and the second fluid comprises hydrogen fluoride gas, and wherein the first fluid and the second fluid are adapted to react inside the chamber to form a self-limiting etchable layer on a portion of the adapted surface layer of the workpiece.

9. The apparatus of claim 1, wherein three consecutive rings of the I rings are denoted as rings $R_K$, $R_{K+1}$, $R_{K+2}$ and are arranged in an alternating pattern such that either rings $R_K$ and $R_{K+2}$ are rings of the first type and ring $R_{K+1}$ is a ring of the second type or rings $R_K$ and $R_{K+2}$ are rings of the second type and ring $R_{K+1}$ is a ring of the first type, subject to K being selected from the group consisting of 1, 2, . . . , and I-2.

10. The apparatus of claim 9, wherein I at least 4, wherein if I is an odd positive integer then the $I_1$ rings of the first type consist of $R_1$, $R_3$, . . . , $R_I$ and the $I_2$ rings of the second type consist of $R_2$, $R_4$, . . . , $R_{I-1}$, and wherein if I is an even positive integer then the $I_1$ rings of the first type consist of $R_1$, $R_3$, . . . , $R_{I-1}$ and the $I_2$ rings of the second type consist of $R_2$, $R_4$, . . . , $R_I$.

11. A distribution plate, comprising:

I rings within the distribution plate and around a common point on the distribution plate such that no other ring exists within the distribution plate, wherein each ring of the I rings is formed within a corresponding groove in the distribution plate such that each ring is the only ring within its corresponding groove;

wherein I is an integer of at least 3, wherein the I rings are denoted as $R_1$, $R_2$, . . . , $R_I$ in order of increasing distance from the common point and consist of $I_1$ rings of a first type and $I_2$ rings of a second type such that $I_1$ is at least 1, $I_2$ is at least 1, and $I_1+I_2=I$, wherein the I rings collectively comprise N channels and no other channels such that each ring of the I rings comprises at least 2 channels of the N channels and no other channels, wherein a flow inlet of each channel of the at least 2 channels of each ring are positioned at a same constant distance from the common point, wherein N is at least 2*I, wherein the N channels consist of $N_1$ channels of a first kind within the $I_1$ rings of the first type and $N_2$ channels of a second kind within the $I_2$ rings of the second type such that $N_1+N_2=N$, wherein each channel of the $N_1$ channels of a first kind is oriented at a same constant angle $\theta_1$ with respect to an exposed surface of the distribution plate and provides a first fluid to flow into a chamber at the same constant angle $\theta_1$ with respect to the exposed surface of the distribution plate, wherein each channel of the $N_2$ channels of the second kind is oriented at a same constant angle $\theta_2$ with respect to the exposed surface of the distribution plate and provides a second fluid to flow into the chamber at the same constant angle $\theta_2$ with respect to the exposed surface of the distribution plate, wherein the chamber is adapted for holding a workpiece having a surface layer adapted for being etched, wherein $\theta_1$ and $\theta_2$ are each at least 45 degrees and less than 90 degrees, wherein $\theta_1$ is unequal to $\theta_2$, wherein the first fluid differs from the second fluid, and wherein three consecutive rings of the I rings are denoted as rings $R_K$, $R_{K+1}$, $R_{K+2}$ and are arranged in an alternating pattern such that either rings $R_K$ and $R_{K+2}$ are rings of the first type and ring $R_{K+1}$ is a ring of the second type or rings $R_K$ and $R_{K+2}$ are rings of the second type and ring $R_{K+1}$ is a ring of the first type, subject to K being selected from the group consisting of 1, 2, . . . , and I–2.

12. The distribution plate of claim 11, wherein paths of the $N_1$ channels and the $N_2$ channels originate in an XY plane of the distribution plate, and wherein each angle $\theta_1$ and $\theta_2$ is at least 45 degrees and less than 90 degrees with respect to the XY plane and wherein each angle $\theta_1$ is offset from the XY plane at an offset angle $\alpha_1$ and $\beta_1$ with respect to the XY plane, and wherein each angle $\theta_2$ is offset from the XY plane at an offset angle $\alpha_2$ and $\beta_2$ with respect to the XY plane, and wherein $\alpha_1$, $\beta_1$, $\alpha_2$, and $\beta_2$ are selected from the group consisting of from about 0 to −45 and from about 0 to +45 degrees with respect to the XY plane.

13. The distribution plate of claim 11, wherein I is at least 4, wherein if I is an odd positive integer then the $I_1$ rings of the first type consist of $R_1$, $R_3$, . . . , $R_I$ and the $I_2$ rings of the second type consist of $R_2$, $R_4$, . . . , $R_{I-1}$, and wherein if I is an even positive integer then the $I_1$ rings of the first type consist of $R_1$, $R_3$, . . . , $R_{I-1}$ and the $I_2$ rings of the second type consist of $R_2$, $R_4$, . . . , $R_I$.

14. The apparatus of claim 11, wherein the first fluid comprises ammonia gas and the second fluid comprises hydrogen fluoride gas, and wherein the first fluid and the second fluid are adapted to react inside the chamber to form a self-limiting etchable layer on a portion of the adapted surface layer of the workpiece.

* * * * *